(12) United States Patent
Nakamura

(10) Patent No.: US 7,902,906 B2
(45) Date of Patent: Mar. 8, 2011

(54) DRIVING CIRCUIT OF DRIVING LIGHT-EMITTING DEVICE

(75) Inventor: Hiroyuki Nakamura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 607 days.

(21) Appl. No.: 11/961,733

(22) Filed: Dec. 20, 2007

(65) Prior Publication Data

US 2008/0169771 A1    Jul. 17, 2008

(30) Foreign Application Priority Data

Jan. 15, 2007  (JP) .................................. 2007-006175
Nov. 16, 2007  (JP) .................................. 2007-298401

(51) Int. Cl.
*G05F 1/10* (2006.01)

(52) U.S. Cl. ......... 327/535; 327/538; 327/530; 327/540; 327/534

(58) Field of Classification Search .................. 327/108, 327/109, 530, 538, 535, 540, 534; 315/247, 315/246, 209 R, 169.3, 169.4, 291, 307
See application file for complete search history.

(56) References Cited

U.S. PATENT DOCUMENTS

| | | | |
|---|---|---|---|
| 5,006,732 A | 4/1991 | Nakamura | |
| 6,078,150 A * | 6/2000 | Koyanagi et al. | 315/309 |
| 6,516,015 B1 | 2/2003 | Kimura | |
| 6,670,773 B2 | 12/2003 | Nakamura et al. | |
| 6,870,553 B2 | 3/2005 | Kondo et al. | |
| 6,992,663 B2 | 1/2006 | Nakamura et al. | |

FOREIGN PATENT DOCUMENTS

| | | |
|---|---|---|
| JP | 2000-216486 A | 8/2000 |
| JP | 2003-198047 A | 7/2003 |

OTHER PUBLICATIONS

U.S. Appl. No. 11/961,682, filed Dec. 20, 2007, Applicant Hiroyuki Nakamura.

* cited by examiner

*Primary Examiner* — Tuyet Thi Vo
(74) *Attorney, Agent, or Firm* — Fitzpatrick, Cella, Harper & Scinto

(57) ABSTRACT

A light-emitting device driving circuit capable of reliably performing emission control on a light-emitting device of a low emission threshold (about 10 mA or less) and capable of correcting a distortion due to the Early effect of a transistor in the drive current supplied to the light emitting device. The light limiting device driving circuit includes a current control unit (101) which controls the value of a main current based on a control voltage, a bias current source (CC1) for subtracting a bias current from the main current, and a switching unit (103) which controls emission of light from the light-emitting device by switching, based on the drive signal, a current obtained by subtracting the bias current from the main current or a current based on the current obtained by the subtraction.

10 Claims, 5 Drawing Sheets

CONTROL VOLTAGE-DRIVE CURRENT CHARACTERISTICS

DRIVING CIRCUIT OF DRIVING LIGHT-EMITTING DEVICE

BACKGROUND OF THE INVENTION

1. Field of the Invention

The present invention relates to a driving circuit of driving a light-emitting device.

2. Description of the Related Art

Semiconductor laser diodes are being widely used, for example, for writing in laser beam printers (LBPs) and for writing to or reading from various recording mediums such as compact disks (CDs) and digital versatile disks (DVDs) because they are small in size and low in power consumption. A semiconductor laser diode emits light when a certain threshold current is exceeded. In recent years, with the remarkable reduction in threshold value and improvement in emission efficiency, it has been possible to obtain by a drive current of several milliamperes the amount of emission of light for which a drive current of several ten milliamperes is required in the conventional semiconductor laser diodes. In LBPs, the number of output sheets per minute depends on the switching speed of a semiconductor laser diode and the resolution of an output image depends on the minimum width of an optical pulse that the semiconductor laser diode can output. In a case where a semiconductor diode requires a drive current of several milliamperes such as that for conventional ones, therefore, the parasitic capacitance of the semiconductor laser diode is charged by causing a current by which the semiconductor does not emit light, i.e., a current lower than the threshold, to flow for the purpose of improving the operating speed and the current pulse rise time.

Japanese Patent Application Laid-Open No. 2000-216486 describes a laser drive circuit which biases the gate of an output transistor during a non-outputting period by a diverted current. Also, Japanese Patent Application Laid-Open No. 2003-198047 describes a laser drive circuit which draws out part of a current from a current source to set the bias current during a non-outputting period to a value in the vicinity of the threshold.

Each of the above-described related laser drive circuits biases in advance the gate of an output transistor during a non-outputting by using a current diverted (a partial current drawn out) from a current source to improve response during an outputting period. Currently, the light-emitting device (semiconductor laser diode) have been developed to have an excellent performance, such that a threshold current is reduced into several milliamperes. Accordingly, it is likely that, even at a minimum control voltage, an excessive drive current larger than a suitable level for a desired light emission quantity would flow thereto.

Moreover, a MOS transistor for supplying the drive current has the Early effect. The drive current therefore has a value higher than the ideal value in the vicinity of its minimum and easily exceeds the threshold.

SUMMARY OF THE INVENTION

An object of the present invention is to provide a light limiting device driving circuit capable of reliably performing emission control on a light-emitting device of a low emission threshold (about 10 mA or less) and capable of correcting a distortion due to the Early effect of a transistor in the drive current supplied to the light emitting device.

The present invention provides a driving circuit of driving a light-emitting device provided with a current control unit which controls a main current based on a control voltage, the driving circuit including a bias current source for subtracting a bias current from the main current, and control circuit unit which controls a current obtained by subtracting the bias current from the main current or a current based on the current obtained by subtracting the bias current from the main current, and which thereby causes the light-emitting device to emit light.

The present invention enables a light-emitting device of a low emission threshold to be controlled with reliability. The present invention also enables correction of a distortion due to the Early effect of a transistor in the drive current supplied to the light-emitting device.

Further features of the present invention will become apparent from the following description of exemplary embodiments with reference to the attached drawings.

DESCRIPTION OF THE EMBODIMENTS

First Embodiment

Figure 1:
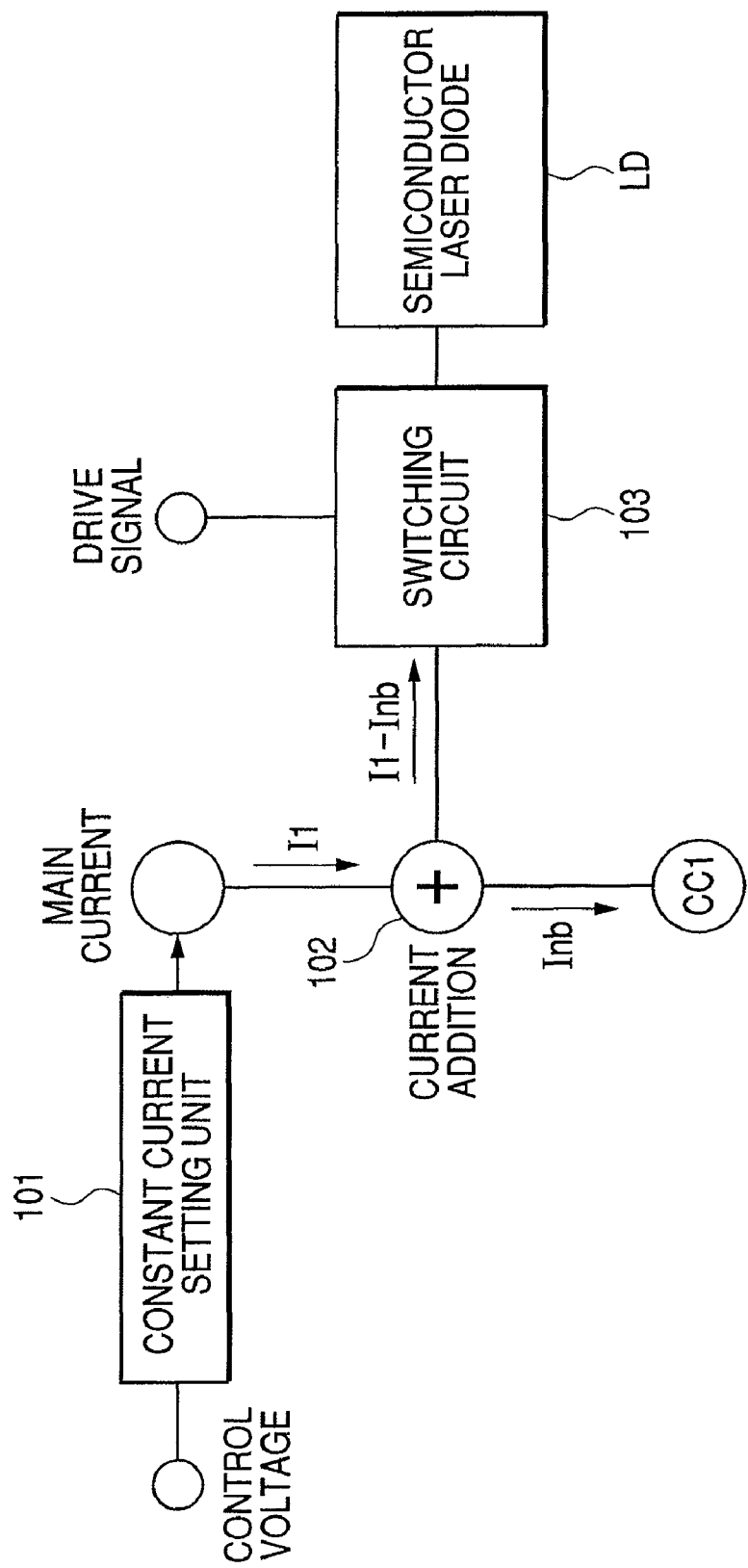
FIG. 1 is a diagram showing an example of a conceptual configuration of a semiconductor laser diode drive circuit according to a first exemplary embodiment of the present invention.

FIG. 1 is a diagram showing an example of a conceptual configuration of a semiconductor laser diode drive circuit (a driving circuit of driving a light-emitting device) according to a first exemplary embodiment of the present invention. Description will be made an example of a case where a semiconductor laser diode is used as a light-emitting device.

A control voltage is input to a current control unit 101. The current control unit (also referred to as a constant current setting unit below) 101 controls the value of a main current I1 for setting a drive current for driving a semiconductor laser diode LD. The main current I1 is a constant current. A bias current source CC1 is a bias current source for subtracting a bias current Inb from the main current I1. The current obtained by subtracting the bias current Inb from the main current I1 is I1–Inb. A current addition unit 102 adds together the main current I1 and the negative bias current Inb and outputs the current I1–Inb to a control circuit unit (also referred to as a switching unit or a switching circuit below) 103. The sum current I1–Inb, i.e., the sum of the main current I1 and the bias current Inb having the polarity opposite to that of the main current I1 is supplied to the current switching circuit 103. A drive current is supplied to the switching circuit 103 when the main current I1 is higher than the bias current Inb having the opposite polarity. The switching circuit (switching unit) 103 controls emission of light from the semiconductor laser diode LD by switching, based on a drive signal, the current I1–Inb or a current based on the current I1–Inb. The switching circuit 103 includes a current amplifying circuit which amplifies the switched current to supply a drive current to the semiconductor laser diode LD.

Let the gain of the current amplifying circuit be n, the control voltage be Vin, the minimum of the control voltage be Vmin, and the threshold current of the semiconductor laser diode be Ith. In this case, the main current I1=Vin/Rs. Rs is the resistance of the circuit through which the main current I1 flows. Since the current ILD by which the light-emitting laser diode LD is driven is ILD=n×(I1−Inb), ILD=n×(Vin/Rs−Inb).

In order to solve the problem to be solved by the invention, it is necessary to satisfy the relationship: drive current ILD<Ith when the control voltage is at the minimum Vmin. Then, ILD=n×(Vin/Rs−Inb)<Ith. Consequently, it is necessary that the main current I1 and the bias current Inb having the opposite polarity satisfy the relationship Inb>Vmin/Rs−Ith/n. Also, the actual occurrence of the problem is considerably increased in relation to the performance of the current analog circuit when light-emitting diode LD threshold current Ith<10 mA. It is preferable that the bias current Inb be higher than the main current I1 when the control voltage Vin is the minimum voltage Vmin.

Figure 2:
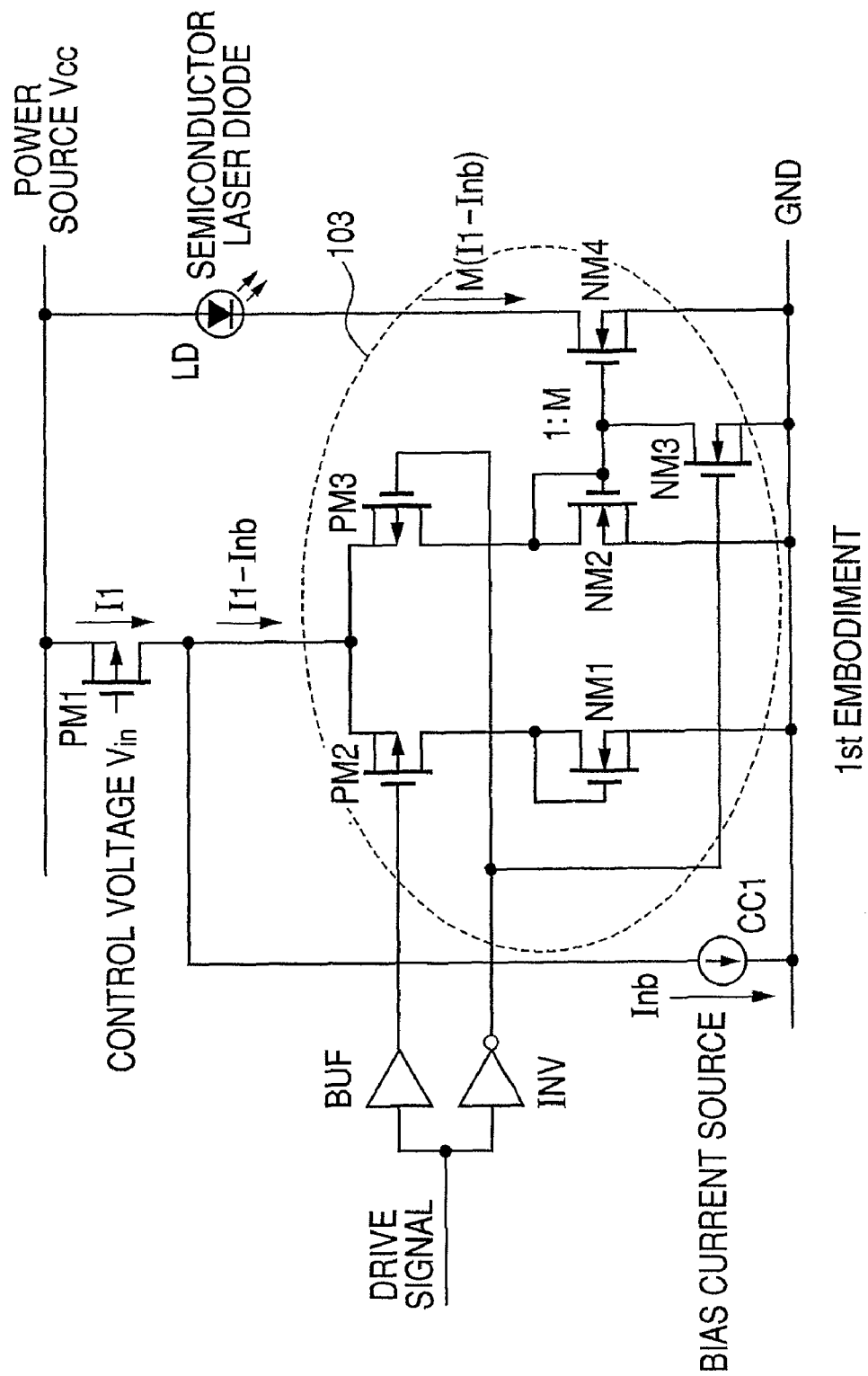
FIG. 2 is a circuit diagram showing an example of a configuration of the semiconductor laser drive circuit according to the first exemplary embodiment.

FIG. 2 is a circuit diagram showing an example of a configuration of the semiconductor laser drive circuit according to the present exemplary embodiment. The switching circuit 103 has transistors PM2, PM3, and NM1 to NM4. The transistor PM1 corresponds to the constant current setting unit 101 shown in FIG. 1.

The transistor PM1 is a PMOS transistor (P-channel MOS field effect transistor) which supplies the main current I1. The control voltage Vin is applied to the gate. The constant current value Inb is a value subtracted from the main current I1 by the bias current source CC1. The transistors PM2 and PM3 are a differential pair of PMOS transistors having their sources connected to a common connection point. The constant current I1−Inb is supplied to the sources via the common connection point. A signal complementary to the drive signal for switching the laser diode LD is input to each gate electrode. The drain of the transistor PM3 is connected to the drain and the gate of the NMOS transistor (N-channel MOS field effect transistor) NM2 constituting a current mirror circuit and to the drain of the NMOS transistor NM3. The drain of the transistor PM2 is connected to the MOS transistor NM1 having the drain and the gate connected to each other, in other words, that is, provided in diode connection form. The NMOS transistor NM4 has a size which is an M multiple of that of the transistor NM2. The drain of the NMOS transistor NM4 is connected to the cathode of the semiconductor laser diode LD. A buffer BUF which buffers the drive signal has its output connected to the gate of the transistor PM2. An inverter INV which generates an inverted signal from the drive signal has its output connected to the gate of the transistor PM3 and to the gate of the transistor NM3. The drain of the transistor NM3 is connected to the gates of current mirror transistors NM2 and NM4.

The switching circuit 103 has a differential amplifying circuit which switches, based on the drive signal, the current I1−Inb obtained by subtracting the bias current Inb from the main current I1. The differential amplifying circuit includes the transistors PM2 and PM3. Also, the switching circuit 103 has a current amplifying circuit which amplifies the current I1−Inb obtained by subtracting the bias current Inb from the main current I1 and causes the amplified current to flow through the semiconductor laser diode LD. The current amplifying circuit is the current mirror circuit including the transistors NM2 and NM4. The operating state of the NM2-NM4 current mirror circuit is controlled by the transistor NM3 based on the drive signal.

Referring to FIG. 2, when the drive signal is high level, the gate of the transistor PM2 is set to high level through the buffer BUF and the gate of the transistor PM3 is set to low level through the inverter INV. Since the output of the inverter INV is connected to the gate of the transistor NM3, the transistor NM3 is in the off state, while the current mirror circuit having the transistors NM2 and NM4 is in the operating state. Since the transistors PM2 and PM3 constitute a differential amplifier, the transistor PM2 is in the off state and the transistor PM3 is in the on state. Accordingly, the whole of the current I1−Inb obtained by subtracting the current Inb of the bias current source CC1 from the current I1 flowing through the transistor PM1 flows through the transistor PM3. The current I1−Inb is supplied from the drain of the transistor PM3 to the transistor NM2. By the M-multiple transistor NM4 constituting the current mirror circuit with the transistor NM2, the current M×(I1−Inb) is caused to flow as the drive current through the semiconductor laser diode LD.

When the drive signal is low level, the transistor PM2 is in the on state, transistor PM3 in the off state and the transistor NM3 in the on state. Since the gates of the current mirror transistors NM2 and NM4 are set to low level by the transistor NM3, no current flows through the semiconductor laser diode LD. The transistor NM1 having the same size as the current mirror transistor NM2 in diode connection form is connected to the drain of the transistor PM2 to make the drain voltages of the transistors PM2 and PM3 in the on state substantially equal to each other. The symmetry of the operations of the differential pair PM2 and PM3 is thereby improved to maintain the duty of the drive signal.

Figure 5:
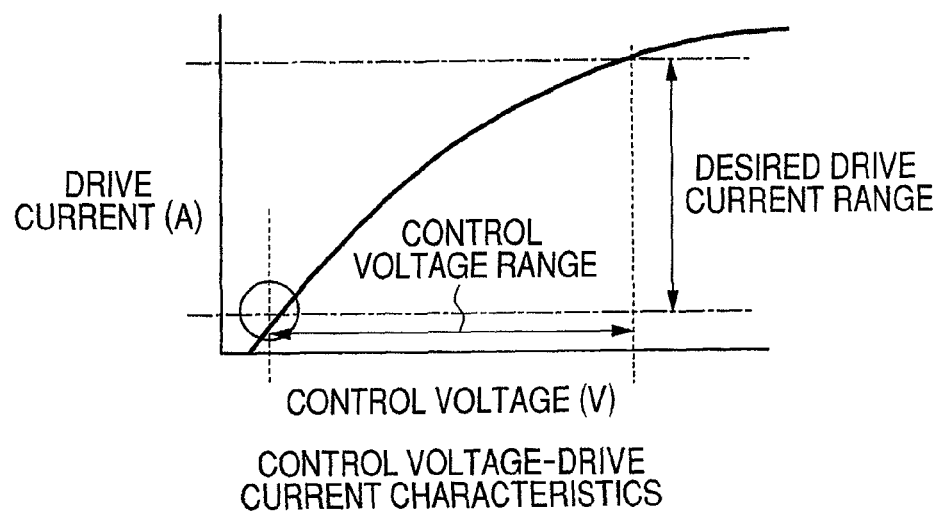
FIG. 5 is a diagram showing a control voltage-drive current characteristic.
Figure 6:
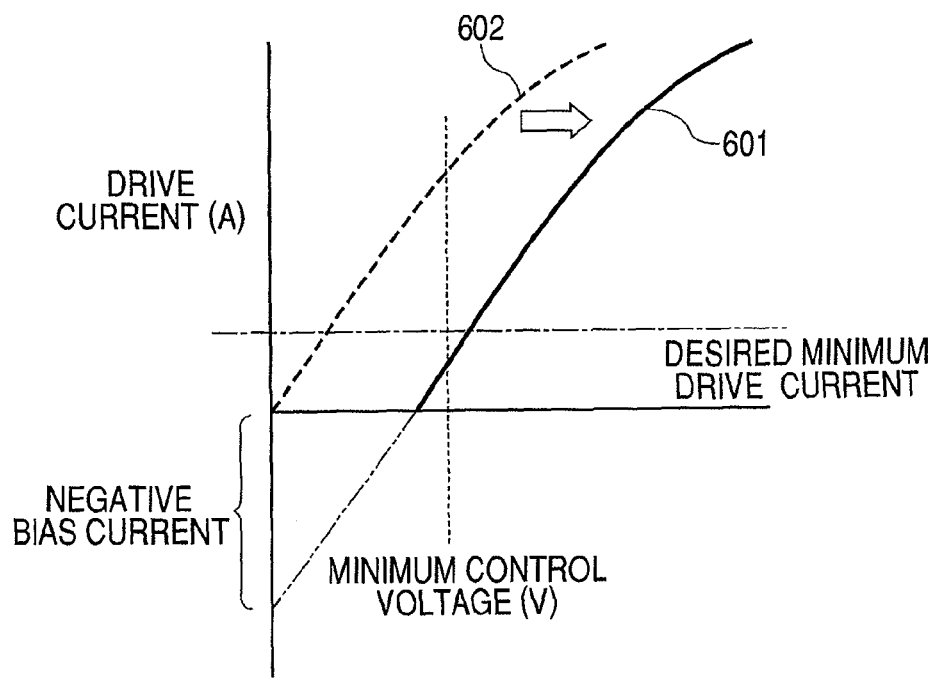
FIG. 6 is an enlarged diagram of a portion of FIG. 5.

Switching of the semiconductor laser diode LD is controlled through high level/low level of the drive signal as described above. FIGS. 5 and 6 show the relationship between the value of the drive current flowing through the semiconductor laser diode LD during this control and the control voltage for setting the drive current value.

FIG. 5 is a graph showing control voltage-drive current characteristics. FIG. 6 is an enlarged diagram of the circled portion of FIG. 5. Characteristic 601 is a characteristic of the semiconductor laser diode drive circuit according to the present exemplary embodiment. Characteristic 602 is a characteristic in a case where the bias current source CC1 is not provided. With characteristic 602, only a drive current exceeding the desired drive current minimum value can be obtained even at the minimum control voltage. Characteristic 601 in the present exemplary embodiment is as if a negative offset current is provided in comparison with characteristic 602, thereby providing the desired drive current minimum value. The control voltage is a voltage input to the constant current setting unit 101 that sets the drive current, as shown in FIG. 1. The constant current value, i.e., the drive current, is controlled by the output voltage of the constant current setting unit 101 according to the dynamic range of the constant current setting unit 101. The desired drive current minimum value can be obtained by the control voltage equal to or higher than the minimum control voltage. Consequently, the desired drive current range can be obtained through the controllable range of the control voltage.

Thus, according to the present exemplary embodiment, drive of the semiconductor laser diode LD free from the influence of the Early effect of the transistor that supplies the drive current can be provided.

Second Embodiment

Figure 3:
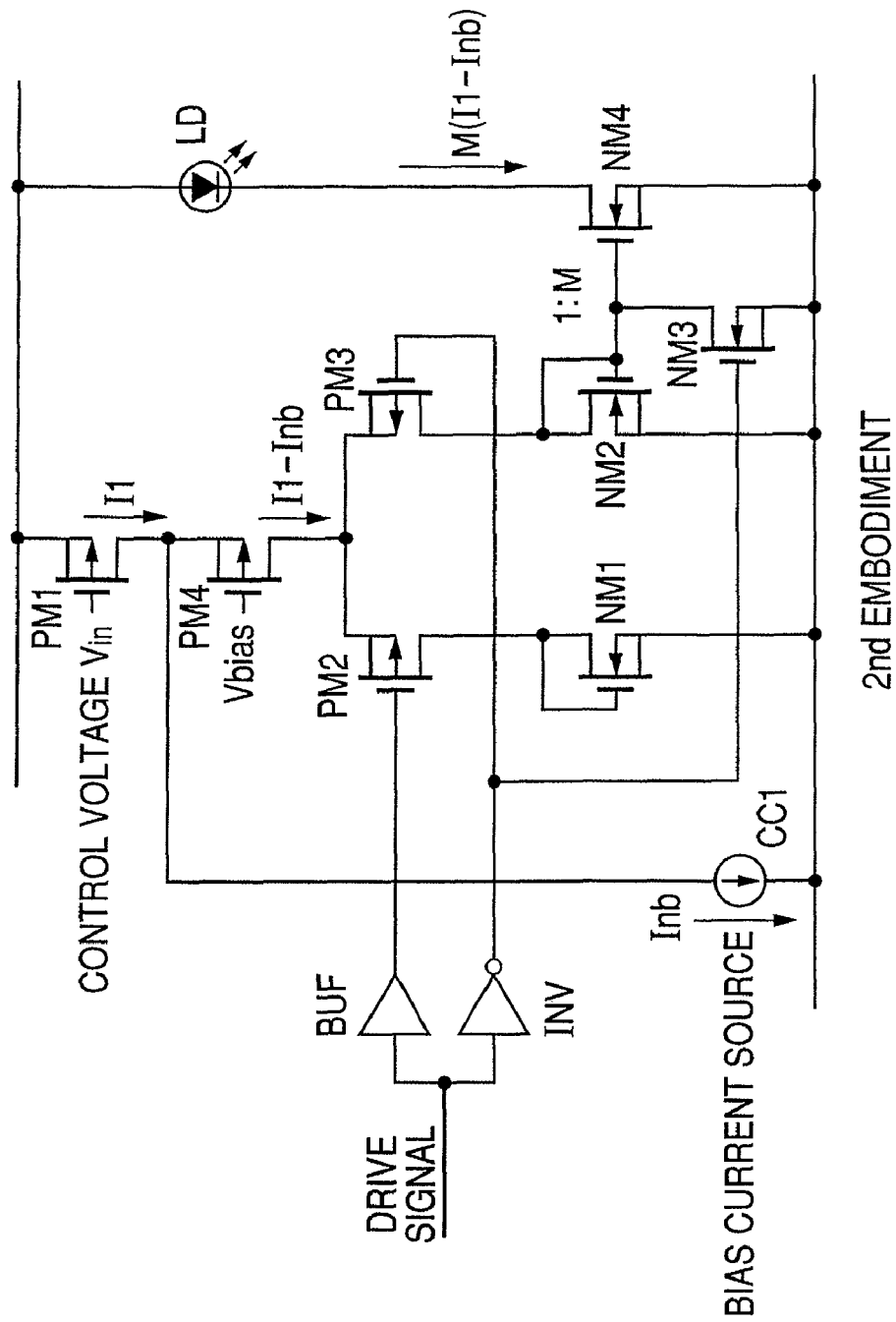
FIG. 3 is a circuit diagram showing an example of a configuration of the semiconductor laser drive circuit according to a second exemplary embodiment of the present invention.

FIG. 3 is a circuit diagram showing an example of a configuration of a semiconductor laser diode drive circuit according to a second exemplary embodiment of the present invention. In the second exemplary embodiment, a gate-grounded PMOS transistor PM4 is inserted between the transistor PM1 and the transistors PM2 and PM3 in the configuration of the first embodiment shown in FIG. 2. In other respects, the second exemplary embodiment is the same as the first exemplary embodiment. A bias voltage Vbias enough for securing the desired source-drain voltage of the transistors PM2 and PM3 is applied to the gate of the transistor PM4. The transistor PM4 is connected between the switching unit 103 and the connection node between the transistor PM1 (constant current setting unit 101) and the bias current source CC1 as a load for constantly maintaining the node potential with respect to the sum current I1−Inb. Thus, a characteristic free from the Early effect of the transistor PM1 on the drive current can be obtained by inserting the transistor PM4.

Third Embodiment

Figure 4:
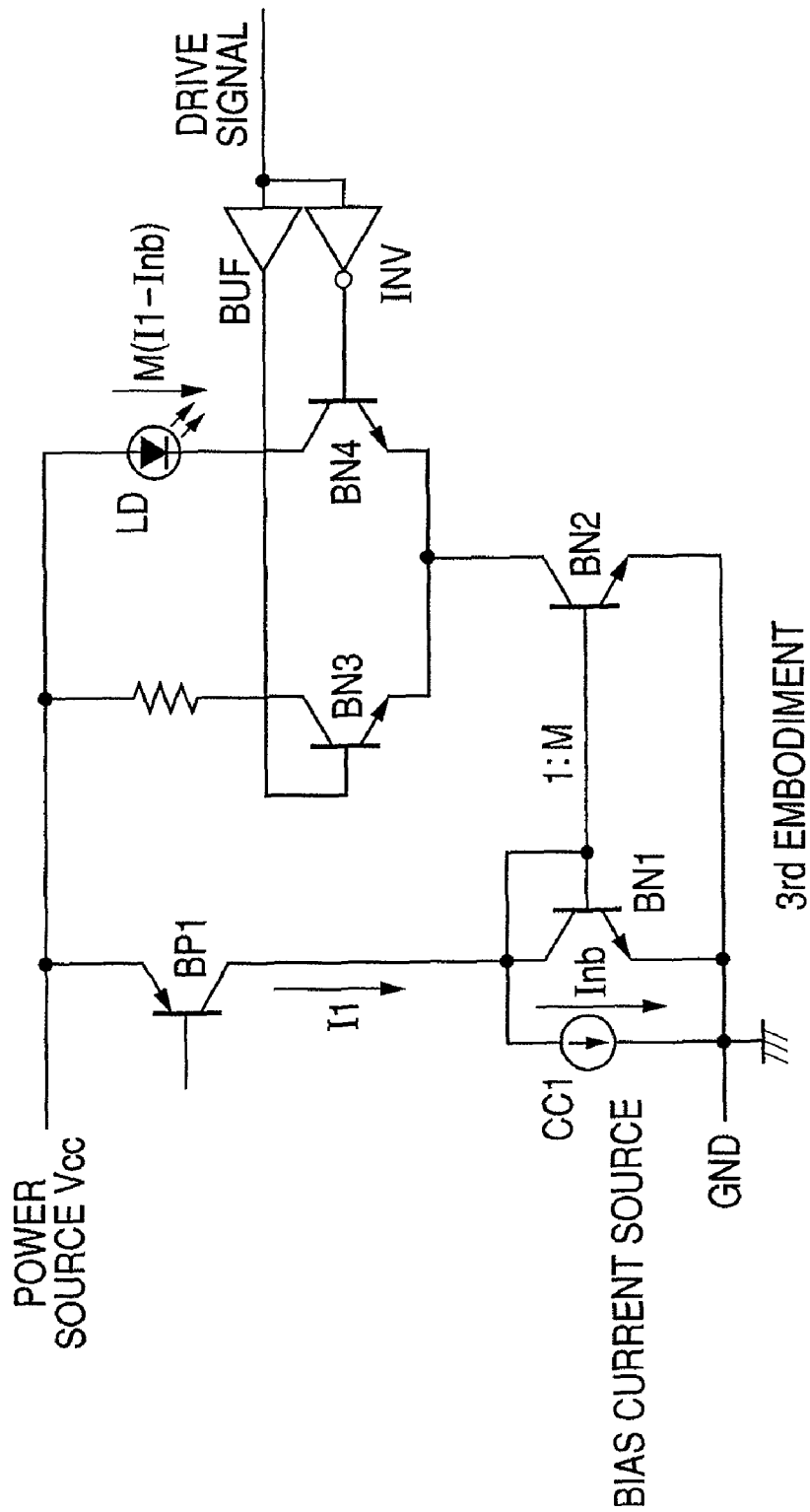
FIG. 4 is a circuit diagram showing an example of a configuration of the semiconductor laser drive circuit according to a third exemplary embodiment of the present invention.

FIG. 4 is a circuit diagram showing an example of a configuration of a semiconductor laser diode drive circuit according to a third exemplary embodiment of the present invention. The third exemplary embodiment represents an application of the present invention to a differential-type drive current switching system.

A PNP bipolar transistor BP1 has its emitter connected to a power supply voltage Vcc. A main current I1 flows through the collector of the PNP bipolar transistor BP1. An NPN bipolar transistor BN1 has its collector connected to the collector of the transistor BP1 and has its emitter grounded. The gate and the collector of the transistor BN1 are connected to each other. A bias current source CC1 is connected between the collector of the transistor BN1 and ground to draw in a constant current Inb. An NPN bipolar transistor BN2 has its base connected to the base of the transistor BN1 and has its emitter grounded. The size of the transistor BN2 is an M multiple of that of the transistor BN1. A buffer BUF buffers and outputs a drive signal. An inverter INV logically inverts the drive signal and outputs the inverted drive signal. NPN transistors BN3 and BN4 have their emitters connected to a common connection point. The emitters connected to the common connection point are connected to the collector of the NPN transistor BN2. The transistor BN3 has its collector connected to the power supply voltage Vcc via a resistor and has its base connected to the output of the buffer BUF. The transistor BN4 has its collector connected to the power supply voltage Vcc via a semiconductor laser diode LD and has its base connected to the output of the inverter INV.

The transistor BP1 corresponds to the constant current setting unit 101 shown in FIG. 1. The transistors BN1, BN2, BN3, and BN4 correspond to the switching circuit 103 shown in FIG. 1. The switching circuit 103 includes a current amplifying circuit which amplifies the current I1−Inb obtained by subtracting the bias current Inb from the main current I1, and a differential amplifying circuit which switches the amplified current according to the drive signal. The current amplifying circuit is a current mirror circuit including the transistors BN1 and BN2. The differential amplifying circuit includes the transistors BN3 and BN4.

The main current I1 flows through the transistor BP1, while the constant current Inb flows through the bias current source CC1. Accordingly, the current I1−Inb flows through the transistor BN1. The transistors BN1 and BN2 constitute a current mirror circuit. The size of the transistor BN2 is an M multiple of that of the transistor BN1. Accordingly, a current M×(I1−Inb) flows through the transistor BN2. When the drive signal is low level, the transistor BN4 is on, the transistor BN3 is off and the current M×(I1−Inb) flows through the semiconductor laser diode LD. When the drive signal is high level, the transistor BN3 is on, the transistor BN4 is off and no current flows through the semiconductor laser diode LD. In the first and second exemplary embodiments, a current flows through the semiconductor laser diode LD when the drive signal is high level. In the present exemplary embodiment, a current flows through the semiconductor laser diode LD when the drive signal is low level.

The present exemplary embodiment has the same effect as that of the first and second exemplary embodiments with respect to the current flowing through the semiconductor laser diode LD.

According to the first to third exemplary embodiments, a drive current characteristic having a negative bias current can be obtained to enable control in the vicinity of the minimum current value. Even in the case of drive by a 3 V single power supply advantageously made by a CMOS process, therefore, desired current control in the vicinity of the minimum current can be performed. Further, the gate-grounded transistor PM4 is inserted between the sum current I1−Inb node and the switching circuit 103 to prevent the influence of an increase in current due to the Early effect. The linearity of the drive current in a low-luminance region can also be improved.

Each of the above-described exemplary embodiments has been described as only an example of implementation of the present invention. The described embodiments are not to be construed as limiting of the technical scope of the present invention. The present invention can be implemented in various forms without departing from the technical spirit or main features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-006175, filed Jan. 15, 2007, and 2007-298401, filed Nov. 16, 2007 which are hereby incorporated by reference herein in their entirety.

What is claimed is:

1. A driving circuit of driving a light-emitting device by controlling a main current through a current control unit based on a control voltage comprising:
   a bias current source for subtracting a bias current from the main current; and
   a control circuit unit for controlling the light-emitting device to emit light by controlling a current provided by subtracting the bias current from the main current, or a current corresponding to the current provided by subtracting the bias current from the main current, wherein the bias current is larger than the main current when the control voltage is at a minimum voltage value.

2. The driving circuit according to claim 1 further comprising a load connected between the current control unit and the control circuit unit.

3. The driving circuit according to claim 2, wherein the load a field effect transistor having a gate to which a bias voltage is applied.

4. The driving circuit according to claim 1, wherein the control circuit unit supplies the light-emitting device with the current provided by subtracting the bias current from the main current, or the current corresponding to the current provided by subtracting the bias current from the main current, based on a driving signal.

5. The driving circuit according to claim 4, wherein
the control circuit unit has a current amplifying circuit for amplifying the current provided by subtracting the bias current from the main current, and a differential amplifying circuit for supplying light-emitting device with the amplified current based on the driving signal.

6. The driving circuit according to claim 5, wherein
the current amplifying circuit is a current mirror circuit.

7. A driving circuit of driving a light-emitting device by controlling a main current through a current control unit based on a control voltage comprising:
   a bias current source for subtracting a bias current from the main current; and
   a control circuit unit for controlling the light-emitting device to emit light by controlling a current provided by subtracting the bias current from the main current, or a current corresponding to the current provided by subtracting the bias current from the main current, wherein
   the control circuit unit supplies the light-emitting device with the current provided by subtracting the bias current from the main current, or the current corresponding to the current provided by subtracting the bias current from the main current, based on a driving signal, and wherein
   the control circuit unit has a current amplifying circuit for amplifying the current provided by subtracting the bias current from the main current, and for supplying the amplified current to the light-emitting device.

8. The driving circuit according to claim 7, wherein
the current amplifying circuit is a current mirror circuit.

9. The driving circuit according to claim 8, wherein
an operation state of the current mirror circuit is controlled based on the driving signal.

10. A driving circuit of driving a light-emitting device by controlling a main current through a current control unit based on a control voltage comprising:
   a bias current source for subtracting a bias current from the main current; and
   a control circuit unit for controlling the light-emitting device to emit light by controlling a current provided by subtracting the bias current from the main current, or a current corresponding to the current provided by subtracting the bias current from the main current, wherein
   the control circuit unit supplies the light-emitting device with the current provided by subtracting the bias current from the main current, or the current corresponding to the current provided by subtracting the bias current from the main current, based on a driving signal, and wherein
   the control circuit unit has a differential amplifying circuit for supplying the light-emitting device with the current provided by subtracting the bias current from the main current based on the driving signal.

\* \* \* \* \*